US006444528B1

(12) United States Patent
Murphy

(10) Patent No.: US 6,444,528 B1
(45) Date of Patent: Sep. 3, 2002

(54) SELECTIVE OXIDE DEPOSITION IN THE BOTTOM OF A TRENCH

(75) Inventor: James J. Murphy, South Jordan, UT (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 09/640,496

(22) Filed: Aug. 16, 2000

(51) Int. Cl.$^7$ ............................................. H01L 21/336
(52) U.S. Cl. ....................... 438/270; 438/589; 438/981
(58) Field of Search .................. 438/138, 268, 438/270, 424, 430, 589, 981

(56) References Cited

U.S. PATENT DOCUMENTS

| | | | |
|---|---|---|---|
| 4,914,058 A | 4/1990 | Blanchard | 438/270 |
| 4,941,026 A | 7/1990 | Temple | 257/333 |
| 4,967,245 A | 10/1990 | Cogan et al. | 438/589 |
| 4,992,390 A | 2/1991 | Chang | 438/270 |
| 5,164,325 A | 11/1992 | Cogan et al. | 438/270 |
| 5,298,781 A | 3/1994 | Cogan et al. | 257/333 |
| 5,473,176 A | * 12/1995 | Kakumoto | 438/270 |
| 5,770,878 A | 6/1998 | Beasom | 257/330 |
| 5,801,417 A | 9/1998 | Tsang et al. | 257/333 |
| 5,879,994 A | 3/1999 | Kwan et al. | 438/268 |
| 6,198,127 B1 * | 3/2001 | Kocon | 257/330 |
| 6,265,269 B1 * | 7/2001 | Chen et al. | 438/270 |

OTHER PUBLICATIONS

Technical Literature from Applied Materials, Farhad Moghadam, "Delivering Value Around New Industry Paradigms," pp. 1–11, vol. 2, Issue, Nov. 1999.

Technical Literature from Quester Technology, Model APT–4300 300mm Atmospheric TEOS/Ozone CVD System, No date.

Technical Literature from Quester Technology, Model APT–6000 Atmospheric TEOS–Ozone CVD System, No date.

Technical Literature from Semiconductor Fabtech, Curtis, et al., APCVD TEOS: 03 Advanced Trench Isolation Applications, 9th Edition, No date.

Technical Literature from Semiconductor International, John Baliga, Options for CVD of Dielectrics Include Low–k Materials, Jun. 1998.

Technical Literature from Silicon Valley Group Thermal Systems, APNext, High Throughout APCVD Cluster Tool for 200 mm/300 mm Wafer Processing, No date.

* cited by examiner

Primary Examiner—Chandra Chaudhari
(74) Attorney, Agent, or Firm—Townsend and Townsend and Crew LLP

(57) ABSTRACT

A gate isolation structure of a semiconductor device and method of making the same provides a trench in a silicon substrate, wherein a dielectric layer is formed on sidewalls and bottom of the trench, the dielectric layer having a first thickness on the sidewalls and a second thickness at the bottom that is greater than the first thickness. The thicker dielectric layer at the bottom substantially reduces gate charge to reduce the Miller Capacitance effect, thereby increasing the efficiency of the semiconductor device and prolonging its life.

21 Claims, 7 Drawing Sheets

SELECTIVE OXIDE DEPOSITION IN THE BOTTOM OF A TRENCH

CROSS-REFERENCES TO RELATED APPLICATIONS

A first related application is filed concurrently with the present application as U.S. patent application Ser. No. 09/640,954 in the names of Henry W. Hurst et al., and entitled "A Method of Creating Thick Oxide on the Bottom Surface of a Trench Structure in Silicon" and assigned to the present assignee. A second related application is filed concurrently with the present application as U.S. patent application Ser. No. 09/640,955 in the names of Izak Bencuya et al., and entitled "Vertical MOSFET with Ultra-Low Resistance and Low Gate Charge" and assigned to the present assignee. Both of these applications are incorporated by reference herein for all purposes.

BACKGROUND OF THE INVENTION

The present invention relates in general to field effect transistors, and in particular to trench transistors and methods of their manufacture.

FIG. 1 is a simplified cross section of a portion of a conventional trench power metal-oxide-semiconductor field-effect transistor (MOSFET). A trench 10 has sidewalls 11 and bottom 17, and is lined with an electrically insulating material 12 that acts as a gate dielectric. Trench 10 is filled with a conductive material 15, such as polysilicon, which forms the gate of the transistor. The trench, and hence the gate, extend from the surface of the silicon into the substrate down through a body region 22 and into a drain region 16. In the example shown in FIG. 1, the body region 22 is a P-type region and the drain region 16 is an N-type region. Drain region 16 may be electrically contacted through the substrate of the device. N-type regions 14 adjacent to and on opposite sides of the trench 10 form the source electrode 18 of the transistor. An active channel region 20 is thus formed alongside of the trench between the N-type regions 14 of the source electrode 18 and the drain region 16.

An important parameter in a trench power MOSFET is the total gate charge. In some applications of conventional trench power MOSFETs, such as DC-DC converters, the lower the gate charge the better the efficiency of the overall design. One major component of the total gate charge is the charge required to supply what is known as the Miller capacitance, which is a parasitic capacitance that forms between the gate and the drain. The Miller capacitance is an effective increase of gate to drain capacitance effect due to a rising drain current in the MOSFET active state. As a result, a higher proportion of the total gate charge flows through the gate-drain capacitance, and the rate of the rise of the gate to drain voltage is reduced, causing negative feedback from the drain circuit to the gate circuit. Thus, an effective way to lower the gate charge is to reduce the Miller Capacitance. One method to decrease the Miller Capacitance is to increase the thickness of the gate dielectric. However a uniformly thicker gate dielectric layer requires higher gate charge, which can detrimentally affect the electrical performance of the transistor.

SUMMARY OF THE INVENTION

The present invention provides a trench metal oxide semiconductor field effect transistor (MOSFET) having a dielectric layer that is thicker at the bottom of the trench as compared to the dielectric layer on the sidewalls of the trench where the transistor channel is formed.

Accordingly, in one embodiment, the present invention provides for gate isolation structure of a semiconductor device that includes a trench in a silicon substrate, and a gate isolation layer formed on sidewalls and bottom of the trench, where the gate isolation layer has a first thickness on the sidewalls and a second thickness at the bottom that is greater than the first thickness.

In another embodiment, the invention provides a method of forming a gate dielectric layer of trench field-effect transistor. The method includes the steps of forming a trench in a silicon substrate, growing a thermal oxide layer on the sidewalls and bottom of the trench, etching away the thermal oxide layer from the bottom of the trench to expose the silicon substrate, and depositing a selective oxide layer at the bottom of the trench over the silicon substrate to a desired thickness, wherein the desired thickness is greater than a thickness of the thermal oxide layer on the sidewalls of the trench.

In another embodiment, the invention provides a method of forming a gate dielectric layer of trench semiconductor device, the method includes the steps of forming a first trench in a silicon substrate, growing a thermal oxide layer on the sidewalls and bottom of the first trench, depositing a layer of nitride over the thermal oxide layer, etching away the thermal oxide layer and the nitride layer from the bottom of the first trench, forming a second trench at the bottom of the first trench to expose the silicon substrate on the sidewalls and bottom of the second trench, and depositing a selective oxide layer into the second trench over the silicon substrate to a desired thickness, wherein the desired thickness corresponds to a depth of the second trench and is greater than a thickness of the thermal oxide layer on the sidewalls of the trench.

In another embodiment, the invention provides a method of manufacturing a trench MOSFET. The method includes the steps of forming a plurality of trenches in a semiconductor substrate having a first conductivity type, each trench defined by sidewalls and a bottom; growing a thermal oxide on the sidewalls and the bottom of the trenches; etching away the thermal oxide layer on the sidewalls and the bottom of the trenches to expose portions of a surface of the semiconductor substrate; depositing a selective oxide layer on the bottom of the trenches over the exposed portions of the surface of the semiconductor substrate to a predetermined thickness, wherein the predetermined thickness is greater than a thickness of the thermal oxide layer on the sidewalls of the trenches; lining the oxide layer and selective oxide layer and filling the trenches with polysilicon; doping the polysilicon with a dopant having a first conductivity type; patterning the substrate and implanting a dopant having a second conductivity type to form a well into which the trenches are positioned; patterning the substrate and implanting a dopant having the second conductivity type to form a plurality of heavy bodies positioned within the well and between trenches; and patterning the substrate and implanting a dopant having the first conductivity type to form source regions within the well, the source regions positioned adjacent to and on opposite sides of each trench.

In yet another embodiment, the invention provides a method forming a trench MOSFET. The method includes the steps of forming a plurality of primary trenches in a semiconductor substrate, each primary trench having sidewalls and a bottom; forming a first dielectric layer on the sidewalls and the bottom of the primary trenches; forming a second dielectric layer over the first dielectric layer; etching through the first and second dielectric layers at the bottom of the primary trenches and into the semiconductor substrate to form a plurality of secondary trenches; filling the secondary trenches with an oxide to a predetermined depth; removing the first and second dielectric layers from the primary trench sidewalls; and forming a gate oxide layer on the primary trench sidewalls.

DESCRIPTION OF THE SPECIFIC EMBODIMENTS

Figure 1:
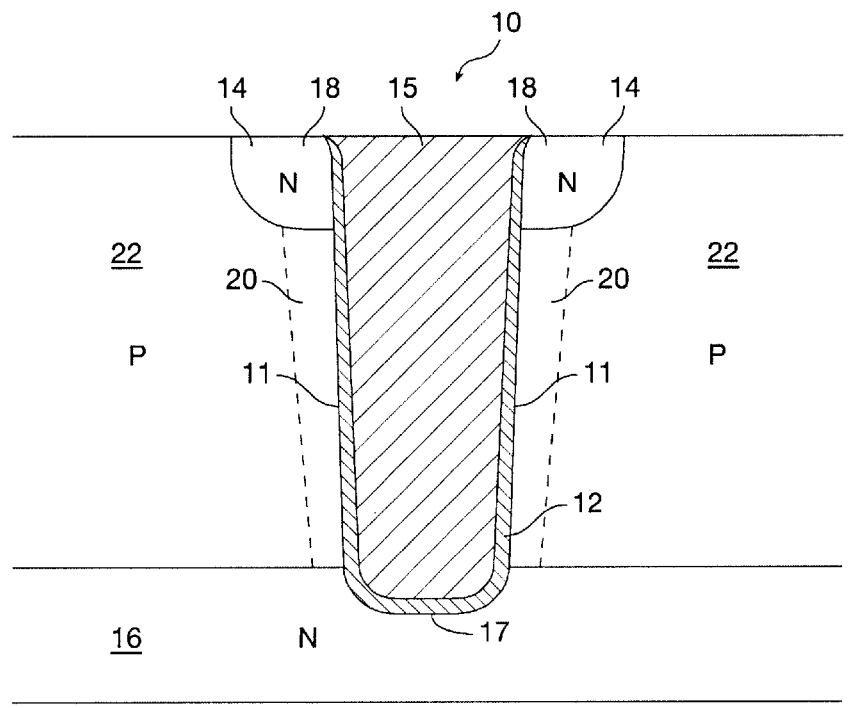
FIG. 1 is a simplified cross section of an exemplary conventional trench transistor.
Figure 2:
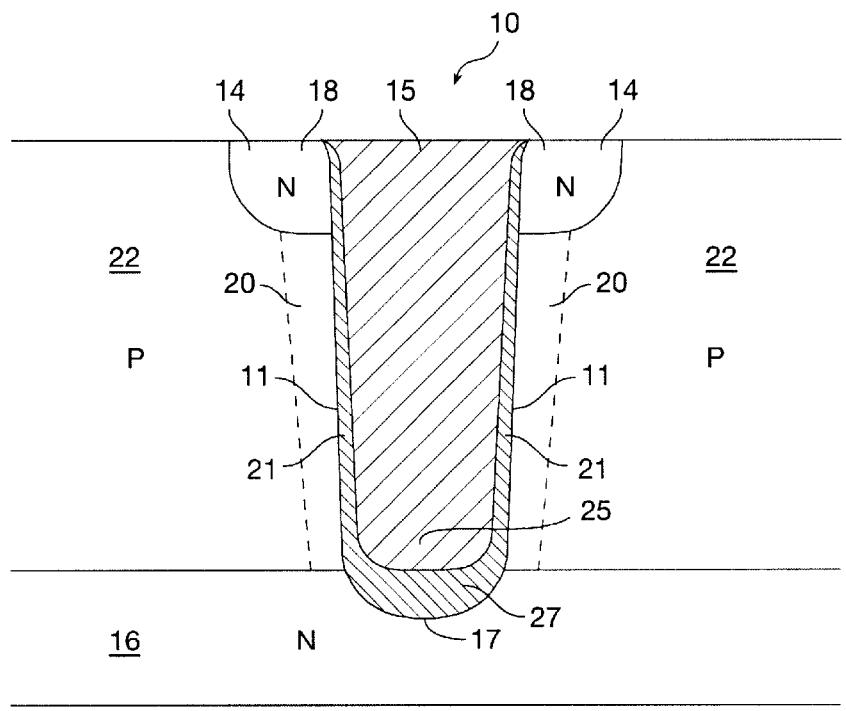
FIG. 2 is a simplified cross section of trench transistor according to an embodiment of the present invention.

FIG. 2 illustrates an exemplary N-type trench transistor with a superior gate isolation structure according to an embodiment of the present invention. A trench 10 with sidewalls 11 and a bottom 17 extends into a silicon substrate body region 22. The source electrode is shown in FIG. 2 as being two N-type regions 14 adjacent to and on opposite sides of the trench 10. The drain electrode is shown as an N-type region 16 below a P-type body region 22. It is to be understood that in the case of a p-type transistor, the conductivity type of each of the drain, source and body regions will be reversed. A conductive material such as doped polysilicon or metal forms the gate 15 of the trench transistor. The gate 15 may extend above, below, or at the level of the top surface of the silicon substrate body region 22. In operation, drain region 16 may be electrically contacted through the substrate of the device, the gate 15 may be electrically contacted via a conductive layer (e.g., aluminum) above the transistor (not shown), and an active channel region 20 will form alongside the trench between the source 18 and the drain 16.

In a preferred embodiment, the gate dielectric layer 21 has a substantially uniform thickness at the sidewalls of the trench, with a bottom layer 27 having a thickness that is greater than the side layer 21. Because in trench MOSFETs the gate-to-drain Miller Capacitance is formed at the bottom of the trench, a thicker dielectric layer on the bottom of the trench directly reduces the gate-to-drain Miller Capacitance. The thinner dielectric layer along the sidewalls of the trench ensures that the overall efficiency and performance of the trench MOSFET is not degraded.

The trench MOSFET with variable gate dielectric thickness according to this embodiment of the invention provides a number of other advantages. With a thicker isolation layer at the bottom, the electric fields across the dielectric material at the bottom of the trench are reduced. The reduced electric fields in turn reduce stress on the dielectric layer. Etch defects in the bottom of the trench can be isolated more effectively by a thicker isolation layer at the bottom of the trench. Further, effects of higher electric fields at the rounded corners at the bottom of the trench are offset by a thicker dielectric layer at the bottom of the trench.

FIGS. 3 through 7 are simplified cross sections of a portion of a trench transistor 30 that illustrate a process of making a superior gate dielectric layer according to an embodiment of the present invention. Trench transistors with superior gate dielectric layers can be fabricated by increasing the dielectric layer thickness at the bottom of a trench, without increasing the dielectric layer thickness on the sidewalls of the trench. These superior gate dielectric characteristics result in trench semiconductor devices with a lower Miller Capacitance and hence, lower and more efficient gate charge characteristics.

Figure 3:
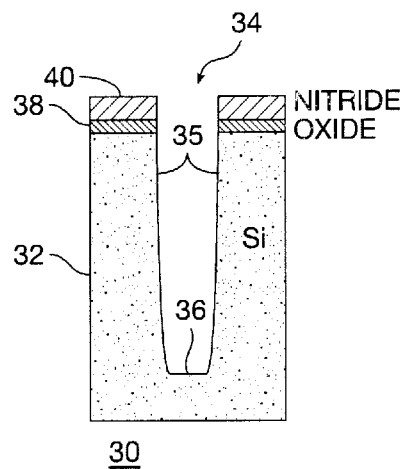
FIGS. 3–7 are simplified cross sections of a trench structure illustrating a process of making a gate isolation structure according to an embodiment of the present invention.

Referring to FIG. 3, a trench 34 is formed in a silicon substrate 32 and includes sidewalls 35 and a bottom 36. In a preferred embodiment, the trench is formed using a nitride/oxide hardmask technique. According to the nitride/oxide hardmask process, a thin oxide layer 38 is either grown or deposited on a silicon substrate top surface, preferably at an approximate depth of, e.g., 250 Å. A nitride film 40 is then deposited on top of the thin oxide layer. The nitride film may be deposited, using either a low pressure chemical vapor deposition technique (LPCVD) or plasma-enhanced CVD, for example, to an approximate depth of, e.g., 1500 Å. The thin oxide layer and nitride film is then patterned using conventional photolithography techniques, and an opening for the trench is etched into the nitride/oxide hardmask. Once etched, the photoresist is removed to expose an opening that defines the width of the trench. Formation of the trench is completed in a preferred embodiment by employing a conventional plasma silicon etch process (e.g. an anisotropic etch).

Figure 4:
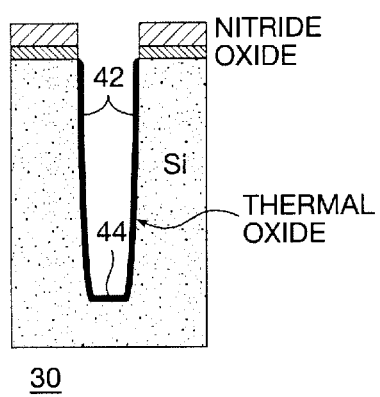

Damage from the silicon etch process is removed by any one of conventional techniques, such as soft etch, annealing, etc. Next, according to an embodiment of the invention as shown in FIG. 4, a sacrificial thermal oxide layer 42 is grown on the sidewalls 35 and bottom 44 of the trench, preferably to an exemplary depth of approximately 300 Å. The thermal oxide layer 42 grows primarily on exposed surfaces of the silicon substrate 32, namely the sidewalls 35 and bottom 44 of the trench 34, but not on top of the silicon wafer where the nitride/oxide layer remains.

Figure 5:
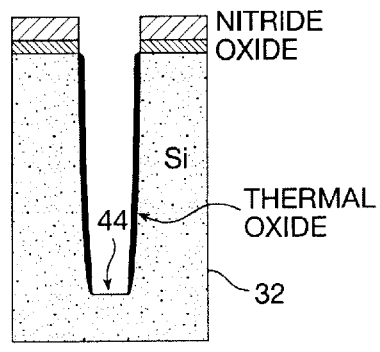

With reference to FIG. 5, the thermal oxide layer 42 is removed at the bottom 44 of the trench 34, preferably by an anisotropic etching process. In a preferred embodiment, the etch process is carefully controlled so as to not affect the hardmask on the wafer surface or the thermal oxide layer 42 on the sidewalls 35 of the trench, but only remove the thermal oxide layer 42 from the bottom 44 of the trench 34. Once the thermal oxide layer 42 is removed from the bottom 44 of the trench 34, a portion of the silicon substrate 32 is exposed.

The thermal oxide layer 42 may then be treated with a high temperature anneal, or with a very short thermal oxidation, e.g., less than 100 Å to repair any damage from the anisotropic etch. Since thermal oxidation occurs at the silicon surface, the overall thickness of the thermal oxide layer 42 on the sidewalls 35 of the trench 34 may increase slightly. This new oxide will be of higher quality than the original thermal oxide layer 42 since the new oxide is grown from the high quality annealed silicon. The new oxide will also grow on the exposed silicon at the bottom 44 of the trench 34 and must be carefully removed, preferably by a wet chemical etch process targeting removal of, e.g., approximately 120 Å of thermal oxide layer 42. An etch process according to this exemplary embodiment will thin the oxide thickness on the sidewalls 35 down to about, e.g., 220 Å.

Figure 6:
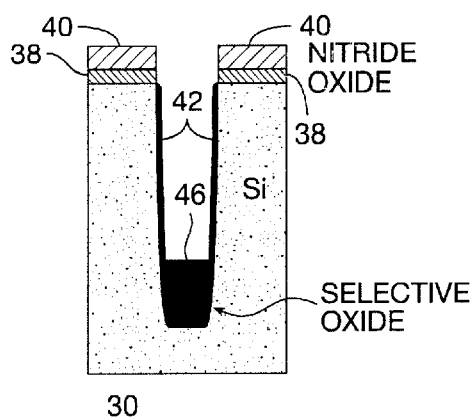

Turning now to FIG. 6, a step of depositing a selective oxide layer 42 at the bottom 44 of the trench 34 is described. The selective oxide layer 46 is deposited on the exposed silicon substrate 32 at the trench 34 bottom 44, according to a process that favors deposition of an oxide on the exposed silicon surface and whereby deposition on the oxide or nitride 40 surfaces is inhibited. According to one embodiment, the selective oxide layer 46 deposition is accomplished using a commercially available ozone/tetraethyl orthosilicate (i.e. ozone/TEOS) film deposit. Process parameters, such as temperature, pressure, gas ratios, etc., are may be optimized such that the oxide is deposited on the exposed silicon and not the oxide or nitride layers, enhancing selectivity of the oxide. The selective oxide is deposited to a desired thickness, preferably in the range of, e.g., 4,000–5,000 Å, and in a specific preferred embodiment to a thickness of, e.g., 4,500 Å. According to the preferred embodiment, the deposition will not likely be completely selective, where, for example, approximately 400 Å of oxide is deposited on the sidewalls of the trench and oxide/nitride hardmask film.

The selective oxide 46 is then densified. In a preferred embodiment, density is increased according to a furnace anneal process where the entire silicon structure is exposed to an exemplary furnace temperature of roughly 1000° C. in nitrogen for approximately 30 minutes. After densification, a short wet hydroflouric (HF) acid dip may be used to remove any non-selective oxide deposition on the nitride hardmask film, typically a removal of about 200 Å. Next, the nitride 40 is selectively removed, preferably in a chemical stripping process such as with exposure to hot phosphoric acid. The sacrificial thermal oxide layer 42 on the sidewalls of the trench and remaining hardmask oxide 38 is then removed, which may also be a wet HF dip, preferably according to a 100:1 buffered oxide etch with a desired overetch to ensure complete removal. Removal of the thermal oxide layer 42 according to the preferred embodiment will also thin the selective oxide layer 46 in the bottom 44 of the trench by the etch amount, but since the selective oxide layer 46 is much thicker than the sidewall oxide layer 42, there will still be a sufficiently ample thickness remaining. In a specific embodiment, the thickness of the remaining selective oxide layer 46 is around 4,000 Å, and no significant topography is added to the wafer surface.

Figure 7:
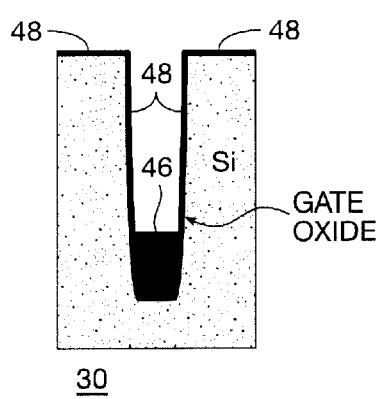

Next, referring to FIG. 7, a thermal gate oxide layer 48 is then grown on the wafer top surface and the sidewalls of the trench. The resultant structure is a trench in a silicon structure having a superior gate oxide, where the gate oxide layer is thicker at the bottom of the trench than a thickness of the oxide layer on the sidewalls of the trench.

Figure 8:
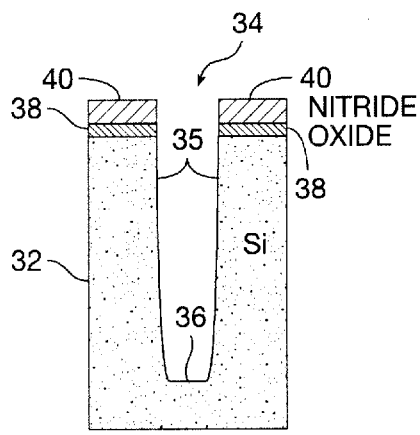
FIGS. 8–13 are simplified cross sections of a trench structure illustrating a process of making a gate isolation structure according to an alternative embodiment of the present invention.

FIGS. 8–13 illustrate an alternative process for making the superior gate oxide according to an embodiment of the present invention. With reference to FIG. 8, a first trench 34 is formed in a silicon substrate 32 as discussed above with reference to FIG. 3. In a preferred alternative embodiment, the first trench is formed using a nitride/oxide hardmask technique in combination with a conventional lithography process, to form the device 30 as shown in FIG. 8.

Figure 9:
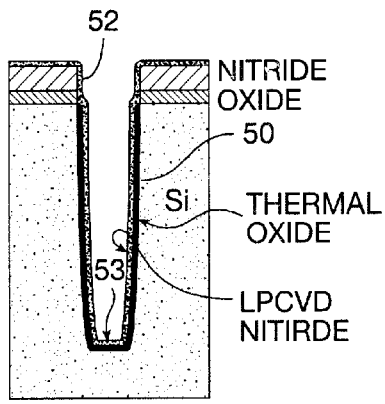

As shown in FIG. 9, damage from the etch process is removed through conventional techniques, and a sacrificial thermal oxide layer 50 is grown over the sidewalls and bottom of the first trench, and which may extend to cover portions of the nitride/oxide hardmask above the first trench. In a preferred embodiment, the sacrificial thermal oxide is grown to a thickness of 300 Å. In accordance with the preferred embodiment of the present invention, the thermal oxide layer 50 is grown primarily on the silicon surfaces exposed on the sidewalls 35 and bottom 36 of the first trench 34, as shown in FIG. 8, but not on the top surface of the silicon wafer where the nitride/oxide layer remains. Next, a thin nitride layer 52, for example, approximately 250 Å of LPCVD or PECVD nitride, is deposited over all surfaces of the structure 30.

Figure 10:
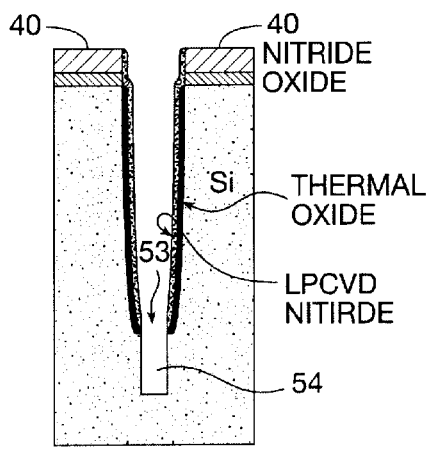

Referring now to FIG. 10, the sacrificial thermal oxide 50 and the nitride 52 at the bottom 53 of the first trench are etched away, such as by an anisotropic etch process. In a specific embodiment, the etch is carefully controlled so as to minimally affect the hardmask on the top surface of the wafer, or the thermal oxide layer 50 and nitride layer 52 on the sidewall of the first trench, but rather only remove the oxide/nitride film 50, 52 from the bottom 53 of the first trench. A second trench 54 may then be formed at the bottom of the trench 53 where the silicon substrate is exposed. In a referred embodiment, a silicon etch is used to etch the second trench, and the second trench 54 is self aligned to the opening etched into the oxide/nitride film 50, 52 removed from the bottom of the trench. In one exemplary embodiment, the depth of the second trench 54 is approximately 4,000 Å, and the silicon etch process according to the exemplary embodiment can be optimized for a desired performance according to parameters discussed above.

The exposed silicon at the bottom 53 of the first trench 34 may be treated with a rounding etch process to round sharp comers where the sidewalls and bottom of the trench intersect, or be exposed to an anneal as desired to remove any damaged silicon. In an embodiment of the invention, any thin oxide grown on the exposed silicon at the bottom 53 of the trench is carefully removed by a wet chemical etch. The wet chemical etch has minimal effect on the thickness of the thermal oxide 50 on the sidewall 35 of the trench.

Figure 11:
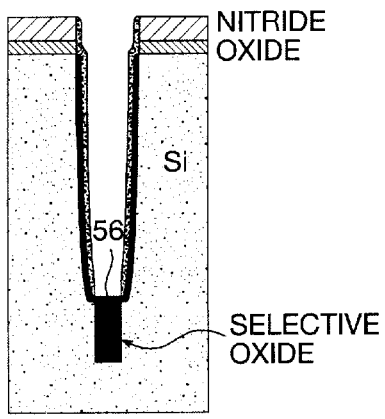

According to the embodiment illustrated in FIG. 9, a selective oxide 56 is deposited on the wafer to fill the second trench 54, up to the bottom surface of the first trench. In an exemplary embodiment, the selective oxide is deposited according to an ozone/TEOS film deposition process. The selective deposition favors deposition on the exposed silicon surfaces, as described above with reference to the embodiment illustrated in FIGS. 3–7. The deposition parameters, i.e.: temperature, pressure, gas ratios, etc., should be optimized to enhance the selectivity of the selective oxide deposition. In one embodiment, silicon is exposed at the bottom of the trench, and to a small degree on the sidewalls near the bottom. Thus, the selective oxide film thickness required to fill the second trench and exposed silicon areas is roughly one-half a width of the first trench, provided the trench depth is greater than the trench width. The selective oxide is deposited to the desired thickness, in a preferred embodiment approximately 1,500 Å. The deposition according to the preferred embodiment may not be completely selective, however, and approximately 200 Å may be deposited on the sidewall and hardmask films. The height of the selective oxide 56 may be tailored for a specific desired effect, i.e.: higher or lower than the exposed surface of the first trench, but in a preferred example is shown in FIG. 11 as relatively flush with the bottom surface of the first trench. The selective oxide 56 may also be densified, preferably be an anneal process as discussed above.

Figure 12:
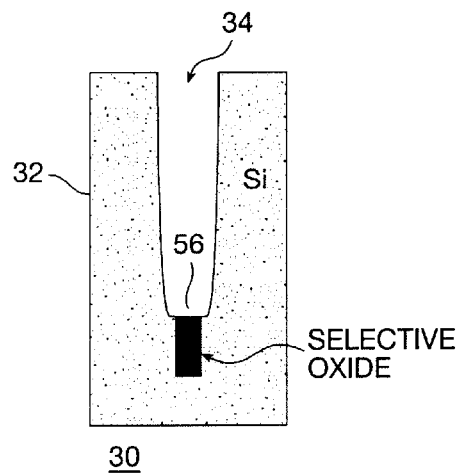

A short wet HF dip may be used to remove any non-selective oxide deposition from the nitride hardmask film, which may be removal of approximately 200 Å, and the nitride may then be selectively removed, preferably in a chemical strip process employing hot phosphoric acid, for example. The sacrificial thermal oxide 50 and remaining hardmask oxide is then removed, as shown in FIG. 12. In one embodiment, a wet HF dip, such as 100:1 BOE, for example, is used with an overetch to ensure complete removal of the thermal oxide from the desired areas. Removal of the remaining thermal oxide also thins out the selective oxide 56 by the etched amount, but since the selective oxide 56 is much thicker than the sidewall oxide there will be ample selective oxide remaining. In one embodiment, the remaining selective oxide has a depth of approximately 3,500 Å, for example. A significant benefit to this alternative embodiment, as well as the embodiment of the invention described above in reference to FIGS. 3–7, is that the process does not add significant topography to the wafer surface.

Figure 13:
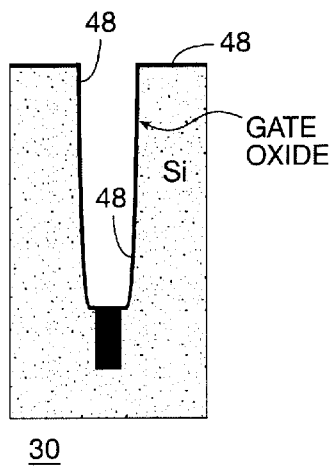

With reference to FIG. 13, a thermal gate oxide 48 can then be successfully grown on substrate surface within the first trench and on the top surface of the wafer. Any additional rounding etch processes can occur at this time to attack any sharp edges or points in the first trench, or sharp corners formed at the junction of the trench sidewalls and bottom. After the step illustrated in the simplified cross section shown in FIG. 13, conventional trench MOSFET manufacturing process steps may be executed.

In an alternative embodiment to the process just described, a two-step silicon etch is performed to form the second trench. An isotropic etch is first performed. This allows the second trench to become as wide or wider than the first trench. Then an anisotropic etch is performed to obtain the desired depth of the second trench.

FIGS. 14–19 illustrate an alternative method for making the superior gate oxide according to an embodiment of the present invention. This method uses a process known as Chemical Mechanical Polishing (CMP) to selectively remove the trench defining hardmask (referred to here as "the CMP approach"). CMP is widely used in the semiconductor industry to reduce topography from high points on the wafer surface or selectively remove blanket films from high points on the wafer surface while leaving the film in recessed areas intact.

Figure 14:
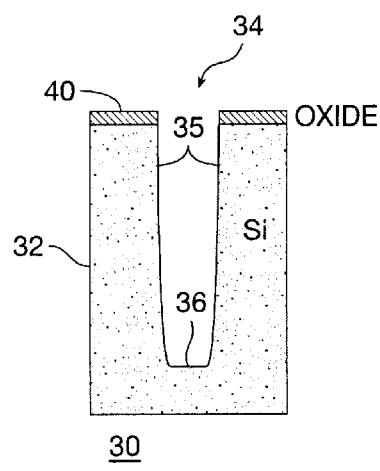
FIGS. 14–19 are simplified cross section of a trench structure illustrating a process of making a gate isolation structure according to an alternative embodiment of the present invention.

The first step in the CMP approach is to form a trench 34 in a silicon substrate 32. This is accomplished using a selectively patterned and etched oxide hard mask 40. In other words, an oxide hardmask 40 of about 500 to 1000 Å is grown or deposited on the silicon substrate 32 surface. Oxide hardmask 40 is then patterned using conventional photolithography techniques and an opening is formed by etching through the patterned oxide hardmask 40 to the silicon substrate 32 surface. Once the opening has been defined a trench 34 is formed through the opening and into the silicon substrate 32 using, for example, an anisotropic dry etch. The structure at this point in the process is shown in FIG. 14.

Figure 15:
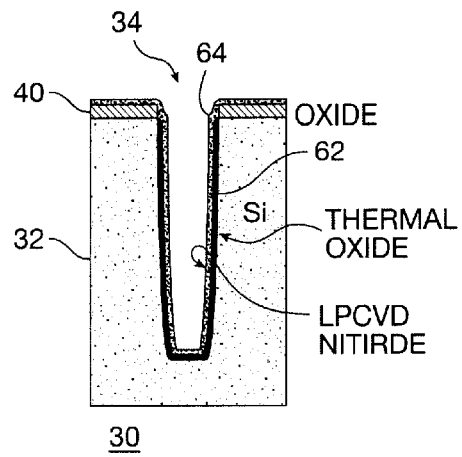

Damage caused by the trench etch is removed through conventional techniques (e.g. soft etch, anneal, etc.) and a sacrificial thermal oxide 62 of approximately 300 Å is grown. Then a thin layer (~250 Å) of nitride 64 is deposited over all surfaces using, for example, a chemical vapor deposition (CVD) process or plasma enhanced chemical vapor deposition (PECVD) process. The structure at this point in the process is shown in FIG. 15. The sacrificial oxide 62 and nitride at the bottom 36 of the trench 34 are then etched away using an anisotropic etch. This etch is carefully controlled so as to minimally attack hardmask 40 or the oxide 62 and nitride 64 layers on the sidewalls 35 of the trench 34.

Figure 16:
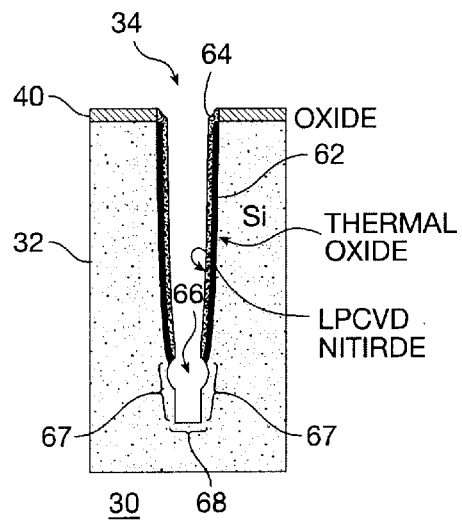
Figure 17:
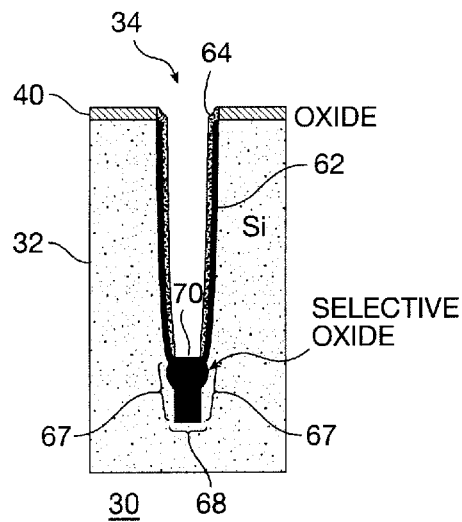

Next, an isotropic silicon etch is performed to etch a second trench 66 through the bottom of the original trench 34. Use of an isotropic etch allows the second trench to become as wide or wider than the width of the original trench 34. Optionally, an anisotropic etch can then be performed on the second trench 66 to optimize the trench depth according to desired performance characteristics. The structure at this point in the process is shown in FIG. 16. After the second trench 66 has been performed, the newly exposed silicon can be treated with a rounding etch or anneal to remove any damaged silicon.

After the second trench 66 has been formed, a selective oxide deposition (e.g. commercially available ozone/TEOS film) is deposited on the structure 30. This selective deposition favors deposition on exposed silicon surfaces and is inhibited on oxide and nitride surfaces. Accordingly, because silicon is exposed along the sides 67 and at the bottom 68 of the second trench 66 selective deposition occurs in the second trench 66, thereby forming an oxide plug 70. The height of the oxide plug can be tailored for the desired effect but is shown as being relatively flush to the bottom 36 of the original trench 34 in FIG. 17. The selectively deposited oxide is then densified in a furnace anneal process, e.g. at 1000° C. in nitrogen for approximately 30 minutes.

Figure 18:
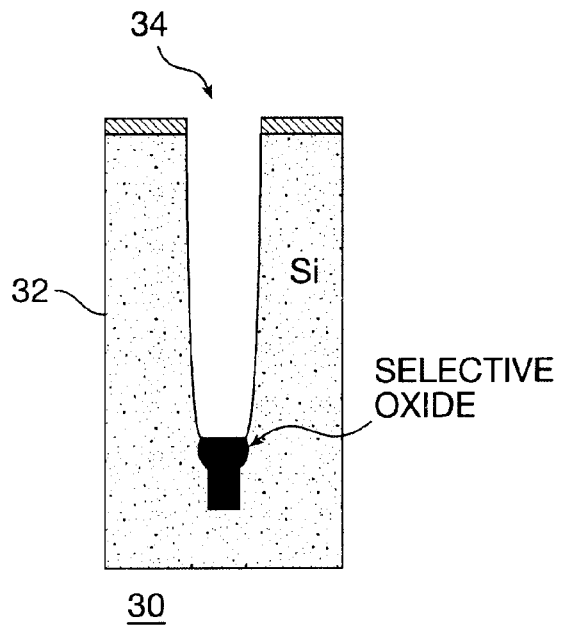

Next, a short HF dip is used to remove any non-selective oxide deposition on the nitride layer 64. Then the nitride is selectively removed in a chemical strip process (e.g. hot phosphoric acid). Any time after this point in the process, CMP can be used to selectively remove the hardmask 40. The sacrificial oxide 62 is then removed in a wet HF dip (such as a 100:1 BOE). The oxide plug 70 is also thinned by the etched amount. However, because the oxide plug 70 is much thicker (in this example ~3500 Å) than the sacrificial oxide (~300 Å), the thinning is not relatively substantial. The structure 30 in this point in the process is shown in FIG. 18.

Figure 19:
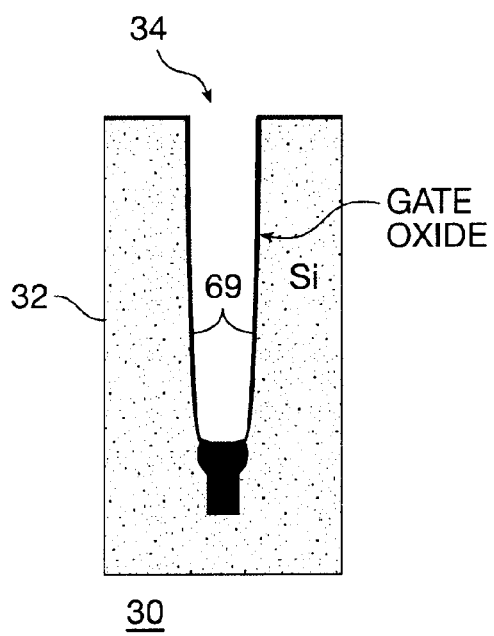

At this time in the process any additional rounding etches can be performed to remove any sharp points formed in the sidewall at the junction of the original 34 and second 66 trenches. Finally, a thermal gate oxide 69 is grown on the surface of the substrate 32 and over the sidewalls of the trench 34 as shown in FIG. 19.

It should be pointed out that with use of the CMP approach, it is not necessary that the hard mask be used at all. In other words, a conventional photoresist mask could be used. However, use of the hardmask is preferred since it has the effect of increasing the deposition rate at the bottom of the trench. Also, this CMP approach can be used in the other embodiments described previously, but is described here for demonstrative purposes.

Once the gate oxide is formed, a trench MOSFET can be fabricated using a conventional trench MOSFET processing technique or the trench MOSFET processing technique disclosed in commonly owned and assigned U.S. patent application Ser. No. 08/970,221, entitled "Field Effect Transistor and Method of its Manufacture", filed on Nov. 14, 1997, which is hereby incorporated by reference for all purposes into this application.

While the above is a complete description of specific embodiments of the present invention, various modifications, variations, and alternatives may be employed. For example, alternative lithography and deposition processes may produce the same structure. Alternatively, materials exhibiting characteristics sufficient for either pad oxide or oxidation inhibiting layer may be employed according to the method described herein, for producing a gate isolation layer according to the principles of the invention. It is also to be understood that the specific numbers used for thickness, temperatures, etc., are for example only. Therefore, the scope of this invention should not be limited to the embodiments described, and should instead be defined by the following claims.

What is claimed is:

1. A method of forming a gate dielectric layer of a trench field effect transistor, the method comprising the steps of:
   forming a trench in a silicon substrate;
   growing a thermal oxide layer on the sidewalls and bottom of the trench;
   etching away the thermal oxide layer from the bottom of the trench to expose the silicon substrate;
   depositing a selective oxide layer at the bottom of the trench over the silicon substrate to a desired thickness, wherein the desired thickness is greater than a thickness of the thermal oxide layer on the sidewalls of the trench;
   removing the thermal oxide layer from the sidewalls of the trench; and
   forming a gate oxide layer on the sidewalls of the trench, to a thickness that is less than the desired thickness of the selective oxide layer.

2. The method of claim 1, wherein the selective oxide layer is deposited according to a deposition process wherein oxide is primarily directed for deposition on the exposed silicon substrate surface.

3. The method of claim 1, wherein the thermal oxide layer is grown according to a local oxidation of silicon (LOCOS) process.

4. The method of claim of claim 1, wherein the desired thickness is approximately between 4000 Å and 5000 Å.

5. The method of claim 1, wherein the step of forming a trench further comprises the steps of:
   depositing a thin oxide layer on a top surface of the silicon substrate;
   depositing a patterned nitride film over the thin oxide layer;
   applying a photoresist layer over the patterned nitride film;
   etching the nitride film according to a pattern in the patterned nitride film; and
   removing the photoresist layer.

6. A method of forming a gate dielectric layer for a trench semiconductor device, the method comprising the steps of:
   forming a first trench in a silicon substrate;
   growing a thermal oxide layer on the sidewalls and bottom of the first trench;
   depositing a layer of nitride over the thermal oxide layer;
   etching away the thermal oxide layer and the nitride layer from the bottom of the first trench;
   forming a second trench at the bottom of the first trench to expose the silicon substrate on the sidewalls and bottom of the second trench; and
   depositing a selective oxide layer into the second trench over the silicon substrate to a desired thickness, wherein the desired thickness corresponds to a depth of the second trench and is greater than a thickness of the thermal oxide layer on the sidewalls of the trench.

7. The method of claim 6 further comprising the step of selectively removing portions of the nitride layer from the silicon substrate.

8. The method of claim 6 further comprising the step of densifying the selective oxide layer to a density approximately equal to the thermal oxide layer on the sidewalls of the trench.

9. The method of claim 6, wherein the second trench is formed to a depth of approximately 4000 Å below the bottom of the first trench.

10. The method of claim 6 further comprising the step of annealing the semiconductor device to densify the selective oxide layer.

11. A method of manufacturing a trench MOSFET, comprising the steps of:
    forming a plurality of trenches in a semiconductor substrate having a first conductivity type, each trench defined by sidewalls and a bottom;
    growing a thermal oxide on the sidewalls and the bottom of the trenches;
    etching away the thermal oxide layer on the sidewalls and the bottom of the trenches to expose portions of a surface of the semiconductor substrate;
    depositing a selective oxide layer on the bottom of the trenches over the exposed portions of the surface of the semiconductor substrate to a predetermined thickness, wherein the predetermined thickness is greater than a thickness of the thermal oxide layer on the sidewalls of the trenches;
    lining the oxide layer and selective oxide layer and filling the trenches with polysilicon;
    doping the polysilicon with a dopant having a first conductivity type;
    patterning the substrate and implanting a dopant having a second conductivity type to form a well into which the trenches are positioned;
    patterning the substrate and implanting a dopant having the second conductivity type to form a plurality of heavy bodies positioned within the well and between trenches; and
    patterning the substrate and implanting a dopant having the first conductivity type to form source regions within the well, the source regions positioned adjacent to and on opposite sides of each trench.

12. A method of forming a trench MOSFET comprising the steps of:
    forming a plurality of primary trenches in a semiconductor substrate, each primary trench having sidewalls and a bottom;
    forming a first dielectric layer on the sidewalls and the bottom of the primary trenches;
    forming a second dielectric layer over the first dielectric layer;
    etching through the first and second dielectric layers at the bottom of the primary trenches and into the semiconductor substrate to form a plurality of secondary trenches;
    filling the secondary trenches with an oxide to a predetermined depth;
    removing the first and second dielectric layers from the primary trench sidewalls; and
    forming a gate oxide layer on the primary trench sidewalls.

13. The method of claim 12 wherein the step of etching is performed using an isotropic etch.

14. The method of claim 12 wherein the step of etching comprises the steps of:
    performing an isotropic etch; and
    performing an anisotropic etch,
    wherein the isotropic etch is controlled so that the secondary trenches can be made as wide or wider than the primary trenches.

15. The method of claim 12 wherein the first dielectric layer is an oxide.

16. The method of claim 12 wherein the second dielectric is a nitride.

17. The method of claim 12 wherein the thickness of the oxide layer in the secondary trenches is greater than the thickness of the gate oxide.

18. The method of claim 12 wherein the secondary trenches are formed to a depth of approximately 4000 Å.

19. The method of claim 12 further comprising the steps of:

forming a thin oxide layer over a top surface of the silicon substrate prior to the step of forming the primary trenches;

forming a nitride layer over the thin oxide layer;

patterning the nitride layer; and etching through the thin oxide and nitride layers according to the patterned nitride layer.

20. The method of claim 12 further comprising the steps of:

forming a hardmask over a top surface of the silicon substrate prior to the step of forming the primary trenches;

patterning the hardmask; and etching through the hardmask according to the patterned hardmask.

21. The method of claim 20 further comprising the step of removing the hardmask using chemical mechanical polishing.

* * * * *